(12) United States Patent
Funaki et al.

(10) Patent No.: US 8,362,103 B2
(45) Date of Patent: Jan. 29, 2013

(54) RESIN COMPOSITION, DRY FILM, AND PROCESSED PRODUCT MADE USING THE SAME

(75) Inventors: Katsuhiko Funaki, Sunnyvale, CA (US); Etsuo Ohkawado, Chiba (JP); Kousuke Hirota, Urayasu (JP); Syuji Tahara, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 518 days.

(21) Appl. No.: 12/597,676

(22) PCT Filed: Apr. 30, 2008

(86) PCT No.: PCT/JP2008/001129
§ 371 (c)(1),
(2), (4) Date: Oct. 26, 2009

(87) PCT Pub. No.: WO2008/139720
PCT Pub. Date: Nov. 20, 2008

(65) Prior Publication Data
US 2010/0059263 A1    Mar. 11, 2010

(30) Foreign Application Priority Data

May 11, 2007 (JP) ................. 2007-126378

(51) Int. Cl.
*C08F 2/42* (2006.01)
*C08J 3/28* (2006.01)
*G03C 1/00* (2006.01)
*G03C 1/72* (2006.01)

(52) U.S. Cl. ........ 522/171; 522/134; 522/135; 522/137; 522/141; 522/142; 522/144; 522/151; 522/152; 522/164; 522/162; 522/173; 522/176; 522/182; 522/183; 430/280.1; 430/283.1; 430/286.1; 430/906; 428/473.5

(58) Field of Classification Search ............. 522/76, 522/74, 134, 135, 142, 144, 149, 151, 152, 522/164, 173, 176, 182; 428/280.1, 283.1, 428/286.1, 906, 473.5
See application file for complete search history.

(56) References Cited

U.S. PATENT DOCUMENTS 7,030,170 B2 * 4/2006 Tahara et al. ............. 522/76
2003/0176528 A1    9/2003 Tahara et al.

FOREIGN PATENT DOCUMENTS

| JP | 2000-086761 A | 3/2000 |
|---|---|---|
| JP | 2004-029702 A | 1/2004 |
| JP | 2005-283762 A | 10/2005 |
| JP | 2005-300785 A | 10/2005 |
| JP | 2006-251715 A | 9/2006 |
| WO | WO 02/24774 A1 | 3/2002 |

OTHER PUBLICATIONS

Product List of Photocurable monomers/oligomers from Shin Nakamura Chemical Co, Ltd. (2009). [online]. [retrieved online Feb. 2, 2012]. Retreived from internet: <URL:http://www.shin-nakamura.com/english/products/monomer-oligomer-03.html>.*
International Search Report of Application No. PCT/JP2008/001129 dated Jun. 3, 2008.

* cited by examiner

*Primary Examiner* — Sanza McClendon
(74) *Attorney, Agent, or Firm* — Buchanan Ingersoll & Rooney PC

(57) ABSTRACT

The invention provides a resin composition which develops excellent flame retardance after curing in spite of its being free from halogen-containing compounds and antimony compounds, which are liable to cause environmental load, and which can give a film meeting the recent sever demands for higher flexing resistance and insulation reliability. Specifically, the invention provides a resin composition which comprises (A) a polyimide precursor and (B) an adduct of an organophosphorus compound represented by formula (1) with a compound having four or more (meth)acrylate groups. It is preferable that the resin composition further contain (C) a phosphazene compound.

13 Claims, No Drawings

RESIN COMPOSITION, DRY FILM, AND PROCESSED PRODUCT MADE USING THE SAME

TECHNICAL FIELD

The present invention relates to a resin composition, a dry film, and a processed product made using the same.

BACKGROUND ART

Solder resists have been used as one of protection films for the circuit surface during printed wiring board production. For high packing density, solder resists have been increasingly required to have both high fine patterning capability and high positional accuracy. As a protection film production method that can meet the above requirements, photolithographic patterning using photosensitive resin compositions is widely used. Examples of such photosensitive resin compositions are epoxy-based compositions, which have been widely used as solder resist materials for protection films on metal interconnections (see e.g., Patent Documents 1 and 2).

However, as conventional materials used as sources of protection films contain large amounts of inorganic filler such as barium sulfate or silica, the films produced from these materials have the disadvantages of being less flexible and thus unable to be subjected to bending processing.

To solve this problem protection films are produced using two different materials during printed wiring board manufacture, where a film called "cover lay" is applied to bending areas and a photosensitive solder resist is applied only to patterning areas. A "cover lay" refers to a polyimide film coated with an adhesive. While many of the solder resists are prepared by coating of printed wiring boards with liquid solutions, adhesive-coated polyimide films are folded with a mold and then attached to printed circuit boards with a pressing machine. Thus, with this method, problems like yield reduction occurred due to involvement of two different steps, thus resulting in demand for solder resists which are capable of fine patterning while ensuring flexibility and heat resistance.

Moreover, from the viewpoint of environment protection, recycling of finished products has been strongly encouraged. In this connection, products are strongly desired that can prevent generation of polluting chemicals during the recycling process. However, the current situation is that resin materials used as cover lay materials and interlayer insulating materials for flexible printed wiring boards require sufficient flame retardancy and, therefore, for flame retardancy, many of the resin materials need to contain either halogenated compounds (e.g., brominated aromatic compounds) which will produce dioxins when burned, or toxic antimony compounds. Therefore, halogen- and antimony-free materials with excellent flame retardancy and flexibility as well as high insulation reliability are strongly desired.

Photosensitive cover lay materials for flexible printed wiring boards which can meet the above requirements have been suggested (see e.g., Patent Documents 3-5). Nevertheless, neither of the disclosed materials can sufficiently meet the recent stringent requirements for flexibility and insulation reliability.

In particular, resin materials have not yet been developed which can produce, even containing an environmentally-friendly flame retardant, a cured article which exerts sufficient resistance to electroless plating employed in recent fine patterning processes and which can retain bending durability even after having been exposed to elevated temperatures during a lead-free solder mounting process conducted after electroless plating.

Patent Document 1: International Application Publication No. WO02/24774
Patent Document 2: Japanese Patent Application Laid-Open No. 2005-300785
Patent Document 3: Japanese Patent Application Laid-Open No. 2004-029702
Patent Document 4: Japanese Patent Application Laid-Open No. 2005-283762
Patent Document 5: Japanese Patent Application Laid-Open No. 2006-251715

DISCLOSURE OF INVENTION

Problems to be Solved by the Invention

It is therefore an object of the present invention to provide a photosensitive resin composition which exerts good flame retardancy after being cured and which particularly meets the recent stringent requirements for bending durability and insulation reliability, even without any halogenated compound or antimony compound that has a high risk of putting a load on the environment.

Another object of the present invention is to provide a dry film produced from the above photosensitive resin composition. Still another object of the present invention is to provide a processed product having a resin film obtained by laminating and curing the dry film, and an electric device having the resin film.

Yet another object of the present invention is to form an interconnection protection film capable of high-resolution patterning from the resin composition of the present invention, which photosensitive interconnection film is environmentally-friendly and is excellent in bending durability, flexibility, adhesion, insulation reliability and flame retardancy.

Means for Solving the Problem

The inventors conducted extensive studies to achieve the foregoing objects and as a consequence established that a resin composition containing a polyimide precursor and a specific organophosphorus compound can meet the stringent requirement for bending durability and insulation reliability.

A first aspect of the present invention relates to the following resin composition.

[1] A resin composition including:
(A) polyimide precursor; and
(B) adduct of an organophosphorus compound having the following formula (1) with a compound having four or more (meth)acrylate groups.

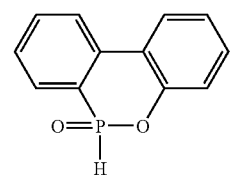

(1)

[2] The resin composition according to [1], wherein the compound having four or more (meth)acrylate groups has the following general formula (2).

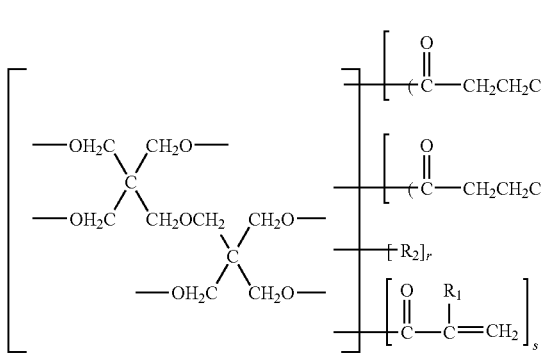

(2)

In general formula (2) $R_1$ denotes a hydrogen atom or methyl group; $R_2$ denotes a hydrogen atom or monovalent organic group; n and m each denote an integer of 1-5; p denotes an integer of 1-6; q and r each denote an integer of 0-4; s denotes an integer of 0-6; the sum of p, q, r and s is 6; and the sum of p and s is 5-6.

[3] The resin composition according to [1] or [2], further including (C) phosphazene compound.

[4] The resin composition according to any one of [1] to [3], further including (D) compound having at least two photopolymerizable unsaturated double bonds, and (E) photopolymerization initiator.

[5] The resin composition according to any one of [1] to [4], wherein (A) polyimide precursor is a polyamic acid.

[6] The resin composition according to [3], wherein (C) phosphazene compound is a phenoxyphosphazene having the following formula (3) or (4).

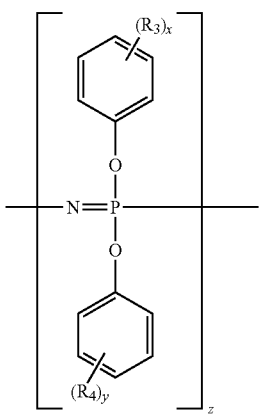

(3)

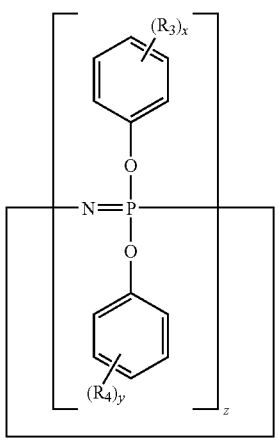

(4)

In general formulas (3) and (4) $R_3$ and $R_4$ each denote a monovalent organic group; x and y each denote an integer of 1-5; and z denotes an integer of 3-20.

[7] The resin composition according to any one of [1] to [6], wherein the amount of (B) component is 5-250 parts by mass per 100 parts by mass of (A) component.

[8] The resin composition according to [3], wherein the amount of (C) component is 5-250 parts by mass per 100 parts by mass of the total of (A) component and (B) component.

[9] The resin composition according to [4], wherein the total of (B) component and (C) component is 1-70 parts by mass per 100 parts by mass of the total of (A) component, (D) component and (E) component.

[10] A dry film produced from a resin composition according to any one of [1] to [9].

[11] A processed product including a resin film formed of a dry film according to [10].

[12] The processed product according to [11], wherein the processed product is a printed wiring board.

[13] An electric device including a processed product according to [11] or [12].

Advantageous Effects of Invention

With a photosensitive resin composition of the present invention, it is possible to provide a high-density flexible printed wiring board which exerts good flame retardancy and which particularly meets the recent stringent requirements for bending durability and insulation reliability, even without any halogenated compound or any antimony compound that has a high risk of putting a load on the environment.

In addition, as the photosensitive resin composition can be readily provided in the form of dry film product, it may contribute to enhance printed wiring board productivity and reduce a load on the environment. In particular, it is possible to provide an environmentally-friendly interconnection protection film which is capable of high-resolution patterning by virtue of its photosensitivity and which is excellent in bending durability, flexibility, adhesion, insulation reliability, and flame retardancy.

BEST MODE FOR CARRYING OUT THE INVENTION

1. Resin Composition

As described above, a resin composition of the present invention contains (A) polyimide precursor and (B) compound having four or more (meth)acrylate groups.

Examples of (A) polyimide precursor contained in the resin composition include polyamic acids and polyamic acids in which some of the carboxylic groups are esterified. Among them, polyamic acids are excellent in heat resistance, insulation property, flexibility and adhesion and thus are advantageous in industrial production. A polyamic acid is a polyimide precursor obtained by reaction between an acid dianhydride (e.g., pyromellitic acid dianhydride) and a diamine compound (e.g., 1,3-bis(4-aminophenoxy)benzene) in polar organic solvent such as N-methylpyrrolidone.

Examples of acid dianhydrides used as sources of polyimide precursors include pyromellitic acid dianhydride, 3,3',4,4'-benzophenonetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 1,1-bis(2,3-dicarboxylphenyl)ethane dianhydride, 2,2-bis(2,3-dicarboxylphenyl)ethane dianhydride, 2,2-bis(3,3-dicarboxylphenyl)ethane dianhydride, 2,2-bis[4-(3,4-dicarboxyphenoxy)phenyl]propane dianhydride, 4,4'-oxydiphthalic acid dianhydride, 2,3,3',4'-biphenylethertetracarboxylic acid dianhydride, 2,3,5,6-pyridinetetracarboxylic acid dianhydride, 3,4,9,10-perylenetetracarboxylic acid dianhydride, 2,3,3',4'-benzophenonetetracarboxylic acid dianhydride, 3,3',4,4'-benzophenonetetracarboxylic acid dianhydride, and 3,4,3',4'-biphenyltetracarboxylic acid dianhydride. It should be noted that acid dianhydrides may be used alone or in combination.

For increased compatibility between polyamic acid and other components contained in the resin composition, preferred examples of acid dianhydrides are, for example, pyromellitic acid dianhydride, 4,4'-oxydiphthalic acid dianhydride, 3,3',4,4'-benzophenonetetracarboxylic acid dianhydride and 3,4,3',4'-biphenyltetracarboxylic acid dianhydride, with pyromellitic acid dianhydride, 4,4'-oxydiphthalic acid dianhydride and 3,4,3',4'-biphenyltetracarboxylic acid dianhydride being more preferable, although depending on the composition of other components in the resin composition.

Examples of diamine compounds used as sources of polyimide precursors include aromatic diamines such as 3,3'-diaminodiphenylether, 4,4'-diamino-3,3',5,5'-tetramethyldiphenylmethane, 4,4'-diamino-3,3'-diethyl-5,5'-dimethyl diphenylmethane, 4,4'-diaminodiphenyl-2,2'-propane, 4,4'-diaminodiphenylmethane, 3,4'-diaminobenzanilide, 4,4'-diaminobenzanilide, 3,3'-diaminobenzophenone, 4,4'-diaminobenzophenone, 3,3'-diethyl-4,4'-diaminodiphenylether, 3,3'-diethoxy-4,4'-diaminodiphenylmethane, 3,3'-dimethyl-4,4'-diaminodiphenylmethane, 3,3'-dimethyl-4,4'-diaminodiphenylpropane, 3,3'-diethyl-4,4'-diaminodiphenylpropane, 3,3'-dimethyl-5,5'-diethyl-4,4'-di aminodiphenylmethane, 3,3'-dimethoxy-4,4'-diaminodiphenylether, 3,3'-dimethoxy-4,4'-diaminodiphenylmethane, 3,3'-dimethoxy-4,4'-diaminodiphenylsulfone, 3,3'-dimethoxy-4,4'-diaminodiphenylpropane, 3,3'-diethoxy-4,4'-diaminodiphenylpropane, 3,3',5,5'-tetramethyl-4,4'-diaminodiphenylmethane, 3,3',5,5'-tetraethyl-4,4'-diaminodiphenylmethane, polytetramethylene oxide-di-p-aminobenzoate, polyethylene oxide-di-p-aminobenzoate, polypropylene oxide-di-p-aminobenzoate, 4,4'-bis(3-aminophenoxy)biphenyl, 4,4'-bis(4-aminophenoxy)biphenyl, 1,3-bis(3-aminophenoxy)benzene, 1,3-bis(4-aminophenoxy)benzene, 1,4-bis(4-aminophenoxy)benzene, 1,3-bis[3-(aminophenoxy)phenoxy]benzene, bis[4-(4-aminophenoxy)phenyl]ether, and 2,2'-bis[4-(4-aminophenoxy)phenyl]propane.

Additional examples of diamines include polyalkylene glycol diamines having the following general formula (5), such as polyethylene glycol diamine, polypropylene glycol diamine, and polybutylene glycol diamine.

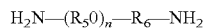

(5)

In general formula (5) $R_5$ and $R_6$ each denote an aliphatic hydrocarbon group having 1-6 carbon atoms; and n denotes an integer of 1-30, preferably 2-20.

Examples of polyalkylene glycol diamines having general formula (5) include polyethylene glycol diamine, polypropylene glycol diamine, polybutylene glycol diamine, polytetramethylene glycol diamine, diamines having block copolymers of polyethylene glycol and polypropylene glycol, diamines having block copolymers of polyethylene glycol and polytetramethylene glycol, diamines having block copolymers of polypropylene glycol and polytetramethylene glycol, and diamines having block copolymers of polyethylene glycol, polypropylene glycol and polytetramethylene glycol.

Specifically, each of $R_5$ and $R_6$ may be a combination of different aliphatic hydrocarbon groups.

Diamine compounds may be alkyl diamines such as dodecane diamine and hexamethylene diamine. Moreover, diamine compounds may be used alone or in combination.

Among the above diamines, 1,3-bis(3-aminophenoxy)benzene, 1,3-bis(4-aminophenoxy)benzene, 1,3-bis[3-(aminophenoxy)phenoxy]benzene, 4,4'-bis(3-aminophenoxy)biphenyl, and polyalkylene glycol diamines such as polypropylene glycol diamine and polybutylene glycol diamine are most preferable.

Polyalkylene glycol diamines are preferable diamine sources of polyimide precursors because they impart low-temperature curability to the resin composition and the cured article exhibits improved flexibility and less warpage. On the other hand, polyimide precursors obtained using polyalkylene glycol diamines may cause reduction in the heat resistance of the resin compositions in which they are contained. For this reason, it is generally preferable to employ a polyimide precursor in which a polyalkylene glycol diamine is copolymerized with another diamine compound which can impart heat resistance. The mole ratio of the polyalkylene glycol diamine to the aromatic diamine compound is preferably 0.05-5.0. When the mole ratio of the polyalkylene glycol diamine to the aromatic diamine compound is 5.0 or less, it is possible to obtain a cured article having sufficient heat resistance. When the mole ratio is 0.05 or more, the resultant cured article offers remarkably improved flexibility and the occurrence of warpage decreases.

The reaction temperature at which a polyamic acid is prepared by polymerization of the above diamine compound with the above acid dianhydride is typically 10-60° C., preferably 20-55° C. The reaction pressure is not specifically limited. The resultant polyamic acid may be partially imidized. Partially-imidized polyamic acids can be prepared by dehydration at elevated temperature around 100-200° C. or by catalytic imidization, for example. The reaction time varies depending on the type of the organic solvent used, reaction temperature, etc., and the time sufficient for the reaction to complete is typically 2-48 hours.

The amount of the polyimide precursor contained in the resin composition is 10-95 wt %, preferably 30-70 wt %, on a solid content basis. When the polyimide precursor content is 10 wt % or more, polyimide features such as heat resistance, chemical resistance and electrical insulating properties can be imparted to the resin composition and its cured article. When the polyimide precursor content is 95 wt % or less, it is possible to impart flame retardancy derived from (B) component or (C) component and photosensitivity derived from (D) component and (E) component to the resin composition.

As described above, a resin composition of the present invention contains (B) adduct of an organophosphorus compound having formula (1) with a compound having four or more (meth)acrylate groups (hereinafter also referred to as "(B) adduct"). As used herein, "(meth)acrylate group" means acrylate group or methacrylate group.

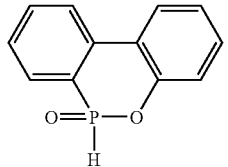
(1)

Preferred examples of (meth)acrylate group-containing compounds include compounds having the following general formula (2).

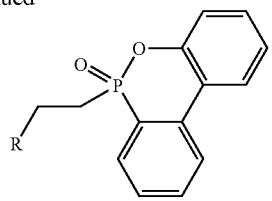

(B) Adducts may be prepared for instance by the method described in Japanese Patent Application Publication (JP-B) No. 55-41610 or Organic Letters (2005), 7(5), 851-853.

It is important that the sum of p and s be 5-6 in order to ensure flexibility even after exposure to high-temperature atmosphere around 260° C.; the sum of q and r is preferably as close to zero as possible for the same reason. The com-

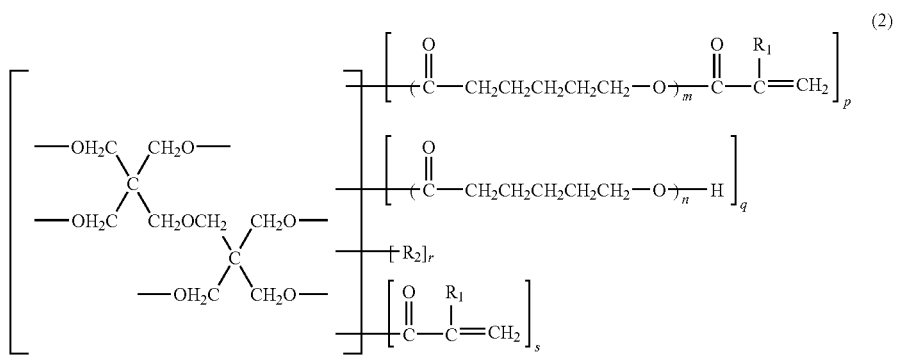
(2)

In general formula (2) $R_1$ denotes a hydrogen atom or methyl group; $R_2$ denotes a hydrogen atom or monovalent organic group; n and m each denote an integer of 1-5; p denotes an integer of 1-6; q and r each denote an integer of 0-4; s denotes an integer of 0-6; the sum of p, q, r and s is 6; and the sum of p and s is 5-6. Among compounds having general formula (2), examples of compounds in which the sum of p and s is 5 or 6 include dipentaerythritol pentaacrylate (p+s=5), dipentaerythritol hexaacrylate (p+s=6), and condensates of dipentaerythritol and ε-caprolactone which are esterified with acrylic acids or methacrylic acids. These compounds are available under the names of KAYARAD®-DPHA, KAYARAD®-DPCA20, KAYARAD®-DPCA30, KAYARAD®-DPCA60 and KAYARAD®-DPCA120 from NIPPON KAYAKU Co., Ltd.; ARONIX® M-402 from TOA-GOSEI Co., Ltd.; LIGHT ACRYLATE DPE-6A from KYOEISHA CHEMICAL Co., Ltd.; DPHA from Daicel-UCB Company, Ltd.; and Actilane 450 from AKCROS CHEMICALS, Ltd.

An adduct of an organophosphorus compound having formula (1) with a (meth)acrylate group-containing compound (e.g., a compound having general formula (2)) may be prepared by addition of an organophosphorus compound having formula (1) to a (meth)acrylate group via the following reaction scheme represented by formula (6).

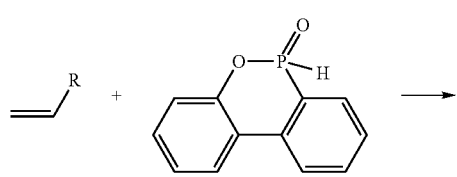
(6)

pound having general formula (2) may be a mixture of a compound in which the sum of p and s is 6 and a compound in which the sum of p and s is 5. In this case the mole ratio of the compound in which the sum of p and s is 6 to the mixture is preferably 0.3-1.0.

Regarding the addition ratio (mole) of the organophosphorus compound having formula (1) to the compound having general formula (2), it is preferable that the ratio of [number of moles of the compound having formula (1)] to [product of the number of moles of the compound having general formula (2) and the value of (p+s)] is 0.2-1.0, more preferably 0.3-0.9. When the addition ratio is 1.0 or less, it is possible to impart higher flame retardancy to the cured article while ensuring its electroless plating resistance. When the mole ratio is 0.2 or more, it is possible to impart higher flame retardancy to the cured article while ensuring its insulation reliability.

In the general formula (2) the monovalent organic group denoted by $R_2$ may be an alkyl group; a carboxy-terminated organic group formed by modifying hydroxyl group with an acid anhydride such as succinic acid anhydride, itaconic acid anhydride or phthalic acid anhydride; vinyl group; or glycidyl group, for example. Preferred examples of $R_2$ are hydrogen atom, methyl group, ethyl group and propyl group, with hydrogen atom being more preferable. Moreover, n and m are each preferably 1 or 2, and the sum of p and s is preferably 5 or 6, and q and r are each preferably 1 or less.

Specific examples of compounds having general formula (2) include dipentaerythritol pentaacrylate, dipentaerythritol hexaacrylate, and condensates of dipentaerythritol and ε-caprolactone which are esterified with acrylic acids or methacrylic acids.

The compounds having general formula (2) are commercially available under the names of KAYARAD®-DPHA, KAYARAD®-DPCA20, KAYARAD®-DPCA30, KAYARAD®-DPCA60 and KAYARAD®-DPCA120 from NIPPON KAYAKU Co., Ltd.; ARONIX® M-402 from TOAGOSEI Co., Ltd.; LIGHT ACRYLATE DPE-6A from KYOEISHA CHEMICAL Co., Ltd.; DPHA from Daicel-UCB Company, Ltd.; and Actilane 450 from AKCROS CHEMICALS, Ltd., for example.

The amount of (B) component in a resin composition of the present invention is preferably 5-250 parts by mass, more preferably 20-200 parts by mass, per 100 parts by mass of (A) component in order for the final product to meet flame retardancy requirements.

A resin composition of the present invention may contain (C) phosphazene compound. When (C) phosphazene compound is added, it is possible to enhance flame retardancy and insulation reliability of the cured article.

The above (C) phosphazene compound is not specifically limited; it is generally produced from oligomers of phosphonitrile dichloride. Examples of (C) phosphazene compound include cyclotriphosphazenes such as hexakis(phenoxy)cyclotriphosphazene, hexakis(phenoxy)aminocyclotriphosphazene, tris(o-phenylenediamino)cyclotriphosphazene, and tris(phenylene-1,2-dioxy)cyclotriphosphazene cyclotetraphosphazenes; and polyphosphazenes.

In view of transparency and flame retardancy, phosphazene compounds having general formulas (3) and (4) are particularly preferable.

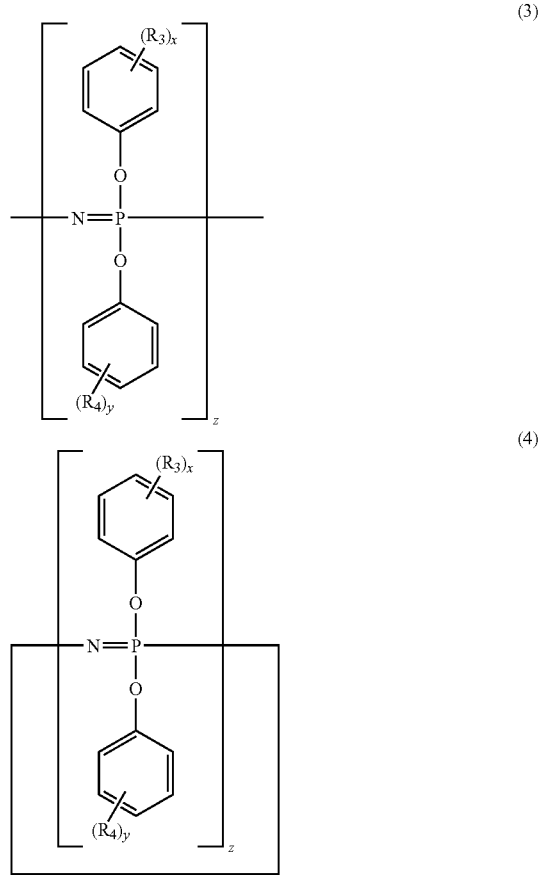

(3)

(4)

In general formulas (3) and (4), $R_3$ and $R_4$ each denote a monovalent organic group; x and y each denote an integer of 1-5; and z denotes an integer of 3-20.

Examples of the monovalent organic group denoted by $R_3$ and $R_4$ in general formulas (3) and (4) include hydroxyl group, alkyl group, alkoxy group, amino group, and aryl group.

Specific preferred examples of phosphazene compounds having general formula (3) or (4) include hexakis(methylphenoxy)cyclotriphosphazene, hexakis(methyloxyphenoxy)cyclotriphosphazene, hexakis(4-tert-butylphenoxy)cyclotriphosphazene, hexaphenoxycyclotriphosphazene, hexakis(hydroxyphenoxy)cyclotriphosphazene, hexakis(phenylphenoxy)cyclotriphosphazene, octaphenoxycyclotetraphosphazene, octakis(hydroxyphenoxy)cyclotetraphosphazene, bis(phenoxy)polyphosphazene, bis(methylphenoxy)polyphosphazene, and bis(hydroxyphenoxy)polyphosphazene.

The amount of (C) component in a resin composition of the present invention is preferably 5-250 parts by mass, more preferably 20-200 parts by mass, per 100 parts by mass of the total of (A) component and (B) component.

The total amount of (B) component and (C) component in a resin composition of the present invention is preferably 1-70 parts by mass per 100 parts by mass of the total of (A) component, (D) component and (E) component. Further, the total amount of (B) component and (C) component in the resin composition is preferably 1-50 parts by mass per 100 parts by mass of the total of (A) component, (D) component and (E) component in order for the final product to meet flame retardancy requirements.

A resin composition of the present invention may further contain a flame retardant other than (B) component and (C) component. The additional flame retardant is not specifically limited; however, preferably, it is generally an organic or inorganic compound other than halogenated organic compounds and antimony compounds. Examples of the flame retardant include, but not limited to, aluminum hydroxide, magnesium hydroxide, magnesium carbonate, calcium carbonate, graphite, heat-expansive graphite, melamine, phosphates, ammonium phosphate, and silicone compounds.

A resin composition of the present invention may contain (D) compound having at least two photopolymerizable unsaturated double bonds in order to impart photosensitivity to the resin composition. By imparting photosensitivity, fine patterning is made possible. Examples of (D) component include compounds having two or more acrylic groups and compounds having two or more vinyl groups.

Specific examples of (D) unsaturated double bond-containing compounds include ethylene glycol di(meth)acrylate, diethylene glycol di(meth)acrylate, triethylene glycol di(meth)acrylate, polyethylene glycol di(meth)acrylate, 1,3-butylene glycol di(meth)acrylate, 1,6-hexanediol di(meth)acrylate, neopentyl di(meth)acrylate, polypropylene glycol di(meth)acrylate, ethylene oxide-modified bisphenol A di(meth)acrylate, ethylene oxide/propylene oxide-modified bisphenol A di(meth)acrylate, tetramethylene oxide-modified bisphenol A di(meth)acrylate, propylene oxide-modified bisphenol A di(meth)acrylate, propylene oxide/tetramethylene oxide-modified bisphenol A di(meth)acrylate, ethylene oxide-modified bisphenol F di(meth)acrylate, ethylene oxide/propylene oxide-modified bisphenol F di(meth)acrylate, tetramethylene oxide-modified bisphenol F di(meth)acrylate, propylene oxide-modified bisphenol F di(meth)acrylate, propylene oxide/tetramethylene oxide-modified bisphenol F di(meth)acrylate, pentaerythritol triacrylate, pentaerythritol tetraacrylate, trimethylolpropane triacrylate, trimethylolpropane/propylene oxide-modified triacrylate, isocyanurate ethylene oxide-modified diacrylate, glycerin di(meth)acrylate, urethane acrylates having two or more (meth)acryloyl groups, dipentaerythritol pentaacrylate, dipentaerythritol hexaacrylate, acrylic acid-modified condensates of dipentaerythritol and c-caprolactone, polyester acrylates, and modified epoxy compounds with acrylic acids. It should be noted that (D) unsaturated double bond-containing compounds may be used alone or in combination.

Preferred examples of (D) component include ethylene oxide-modified bisphenol A di(meth)acrylate, glycerin di(meth)acrylate, urethane acrylates having two or more (meth)acryloyl groups, dipentaerythritol pentaacrylate, dipentaerythritol hexaacrylate, acrylic acid-modified condensates of dipentaerythritol and ε-caprolactone, and polyester acrylates.

A resin composition of the present invention may contain a monofunctional photopolymerizable compound (e.g., a monofunctional acrylate compound) in addition to (D) compound having at least two unsaturated double bonds. Examples of the monofunctional acrylate compound include 2-hydroxyethyl(meth)acrylate, 2-hydroxypropyl (meth)acrylate, 2-ethylhexyl(meth)acrylate, phenoxyethyl acrylate, stearyl methacrylate, lauryl acrylate, dicyclopentenyl acrylate, dicyclopentenyloxyethyl acrylate, dicyclopentanyl acrylate, tetramethylpiperidyl methacrylate, benzyl methacrylate, glycidyl methacrylate, glycerin monomethacrylate, polyethylene glycol mono(meth)acrylate, polypropylene glycol (meth)acrylate, methoxypolyethylene glycol mono(meth)acrylate, and 2-hydroxy-3-phenoxypropyl(meth)acrylate.

The amount of the above photopolymerizable compound ((D) component and monofunctional photopolymerizable compound) is preferably 3-200 parts by mass, more preferably 5-200 parts by mass, further preferably 10-50 parts by mass, per 100 parts by mass of the resin solid content. By setting the photopolymerizable compound content to 200 parts by mass or less, the resin composition can retain solubility in alkaline solution sufficient to enable development, and further, the cured article after imidization can have high flexibility.

A resin composition of the present invention may contain (E) photopolymerization initiator in addition to the above photopolymerizable compound in order to impart photosensitivity. By imparting photosensitivity, fine patterning is facilitated. Specific examples of (E) photopolymerizable initiator include benzophenone, Michler's ketone, benzoin, benzoin ethyl ether, benzoin butyl ether, benzoin isobutyl ether, 2,2-dimethoxy-2-phenylacetophenone, 2-hydroxy-2-phenylacetophenone, 2-hydroxy-2-methylpropiophenone, 2-hydroxy-4-isopropyl-2-methylpropiophenone, 2-ethyl anthraquinone, 2-t-butylanthraquinone, diethylthioxanthone, chlorothioxanthone, benzil, benzyl dimethyl ketal, 1-hydroxycyclohexyl phenyl ketone, benzoylbenzoic acid, 2-methyl-1-(4-methylthiophenyl)-2-morpholinopropane-1-one, 2-benzyl-2-dimethylamino-1-(4-morpholinophenyl)-butanone-1, and 2,4,6-trimethylbenzoyldiphenylphosphine oxide.

Additional examples of (E) photopolymerization initiator include 1 mole adduct or 2-4 mole adducts of ethylene oxide to benzoin; 1 mole adduct or 2-4 mole adducts of propylene oxide to benzoin; α-allylbenzoin; 1 mole adduct or 2-4 mole adducts of ethylene oxide to 1-hydroxycyclohexyl phenyl ketone; 1 mole adduct or 2-4 mole adducts of propylene oxide to 1-hydroxycyclohexyl phenyl ketone; 1 mole adduct of or 2-4 mole adducts of ethylene oxide to benzoylbenzoic acid; 1 mole adduct or 2-4 mole adducts of propylene oxide to benzoylbenzoic acid; 1 mole adduct or 2-4 mole adducts of ethylene oxide to hydroxybenzophenone; 1 mole adduct or 2-4 mole adducts of propylene oxide to hydroxybenzophenone; 4-(2-hydroxyethoxy)-phenyl-(2-hydroxy-2-propyl)ketone; 4-(2-acryloxyethoxy)-phenyl-(2-hydroxy-2-propyl)ketone; 1 mole adduct or 2-4 mole adducts of ethylene oxide to 4-(2-hydroxyethoxy)-phenyl-(2-hydroxy-2-propyl)ketone; 1 mole adduct or 2-4 mole adducts of propylene oxide to 4-(2-hydroxyethoxy)-phenyl-(2-hydroxy-2-propyl)ketone; 1-(4-isopropylphenyl)-2-hydroxy-2-methylpropane-1-one; and 1-(4-decylphenyl)-2-hydroxy-2-methylpropane-1-one. It should be noted that (E) photopolymerization initiators may be used alone or in combination.

Preferred examples of (E) photopolymerization initiator include diethylthioxanthone, benzyl dimethyl ketal, 1-hydroxy cyclohexylphenyl ketone, 2-methyl-1-(4-methylthiophenyl)-2-morpholinopropane-1-one, 2-benzyl-2-dimethylamino-1-(4-morpholinophenyl)-butanone-1, and 2,4,6-trimethylbenzoyldiphenylphosphine oxide.

A resin composition of the present invention may contain a photopolymerization initiator aid for increased polymerization efficiency. Examples thereof include triethanolamine, diethanolamine, monoethanolamine, tripropanolamine, dipropanol amine, monopropanolamine, dimethylamino ethyl benzoate, and 4-dimethylamino isoamyl benzoate. It should be noted that different photopolymerization initiator aids may be used alone or in combination.

The amounts of photopolymerization initiator and photopolymerization initiator aid are each 0.05-10 wt %, preferably 0.5-7 wt %, more preferably 0.5-5 wt % based on the solid content of resin. By setting the total amount of photopolymerization initiator and photopolymerization initiator aid to 0.1 wt % or more, it is possible to obtain a cured article with a cure degree enough to obtain desired resolution. Moreover, by setting the total amount of photopolymerization initiator and photopolymerization initiator aid to 20 wt % or less, it is possible to moderately adjust the polymerization degree of (D) component and thus to control resolution and flexibility of the cured article.

A resin composition of the present invention may further contain additives as needed for the purpose of improving adhesion, varnish antifoaming property, varnish leveling property, etc. Examples of adhesion improvers include 5-mercapto-1-phenyltetrazole, 5-phenyltetrazole, 2-phenylimidazole, and 2,4-diamino-6-phenyl-1,3,5-triazine, which may be used singly or in combination. As antifoaming agents and leveling agents, commercially available acrylic resins and silicone resins can be employed. These additives should be contained in such an amount that does not impair the resin's inherent properties. A typical additive content is 0.01-10 parts by mass, preferably 0.01-5 parts by mass, per 100 parts by mass of the resin composition.

A resin composition of the present invention generally contains a solvent. It is preferable to employ a solvent which readily dissolves the above (A) polyimide precursor partially or entirely. It should be noted, however, that a poor solvent may be employed as long as it improves or does not impair workability (including drying characteristics) and resin's physical properties. The solvent content in the resin composition is not specifically limited as long as it improves or does not impair workability (including drying characteristics) and resin's physical properties. A preferred solvent content is 30-90 wt %, preferably 45-70 wt %, based on the weight of the resin composition. When the solvent content falls within this range, it results in improved leveling characteristics during dry film production to increase dry film quality.

Examples of the solvent include ketones such as acetone, methyl ethyl ketone, methyl isobutyl ketone, cyclohexanone, cyclopentanone, methyl n-amyl ketone, acetonylacetone, isophorone, and acetophenone; alcohols such as ethyl alcohol, isopropyl alcohol, n-butanol, ethylene glycol, diethylene glycol, triethylene glycol, propylene glycol, and hexylene glycol; ethers such as 1,4-dioxane, trioxane, diethyl acetal, 1,2-dioxolane, diethylene glycol dimethyl ether, and tetrahydrofuran; esters such as ethyl acetate, methyl benzoate, ethylene glycol monomethyl ether acetate, ethylene glycol monoethyl acetate, ethylene glycol monopropyl acetate, ethylene glycol diacetate, propylene glycol monomethyl ether acetate, propylene glycol monoethyl ether acetate, propylene glycol monopropyl ether acetate, propylene glycol monobutyl ether acetate, propylene glycol diacetate, diethylene glycol monomethyl ether acetate, diethylene glycol monoethyl ether acetate, and diethylene glycol diacetate; hydrocarbons such as n-heptane, n-octane, cyclohexane, benzene, toluene, xylene, ethylbenzene, and diethylbenzene; and polar aprotic solvents such as dimethylsulfoxide, N,N'-dimethylacetamide, N,N'-dimethylformamide, hexamethylphosphoramide, and N,N'-dimethylimidazolidinone. Any other solvent may be used as long as the effect of the present invention is not impaired.

The solvents may be used singly or in combination. For example, use of a mixture of a low-boiling point solvent and a high-boiling point solvent is preferable as it can prevent foaming in the drying process and may enhance dry film quality.

2. Dry Film and Other Members

A dry film of the present invention can be obtained by drying a coat formed of a resin composition of the present invention. The solid content of the resin composition to be applied is preferably set to 30-90 wt %. Preferably, the resin composition is uniformly applied onto a colorless transparent carrier film of given thickness, The colorless transparent carrier film may be a film made of low-density polyethylene, high-density polyethylene, polypropylene, polyester, polyethylene terephthalate, polycarbonate, polyarylate, or ethylene/cyclodecene copolymer (APEL®, Mitsui Chemicals, Inc.). As the physical properties and coating condition of the resin composition are susceptible to water content, the carrier film is preferably a resin film with low moisture permeability. Therefore, APEL®, polyethylene terephthalate, polyethylene, and polypropylene are more preferable materials.

The thickness of the carrier film is typically 15-100 μm, preferably 15-75 μm. When the thickness falls within this range, the carrier film exhibits excellent coating properties, adhesion properties, rolling properties, rigidity, and cost effectiveness. More preferable is a polyethylene terephthalate film with a thickness of 15-100 μm, preferably 15-40 μm.

Application of a resin composition onto a carrier film can be accomplished with a known means such as a reverse roll coater, gravure roll coater, comma coater, or curtain coater. Drying of the resulting coat is accomplished by hot-air drying or with a dryer using far infrared rays or near infrared rays, at a temperature of 50 to 120° C., preferably 60 to 100° C., for a period of 2-30 minutes.

A cover film may be attached to the resin composition layer on the carrier film for protection of the resin composition layer.

The cover film is preferably a low-moisture permeability resin film as is the carrier film, but is not necessarily required to be transparent. The cover film also needs to be readily peeled off and, therefore, it is required that the adhesion between the cover film and resin layer be smaller than the adhesion between the carrier film and resin layer. Preferably, the cover film is a resin film which is made of APEL®, polyethylene terephthalate, polyethylene or polypropylene and is 5-100 μm in thickness.

Herein, an article having a coat or the like produced from a dry film of the present invention is referred to as a "processed product." A "processed product" is, for example, a printed wiring board. Specifically, after removing the cover film, the dry film is placed onto the circuit surface of a printed wiring board and is then thermally press-bonded by a known method such as plane pressing or roll pressing. In this way a resin composition layer is formed on the printed wiring board. Thermal pressing is conducted at a pressure of 0.2-3 MPa at 40-150° C., preferably at 50-120° C.

By setting the thermal press bonding-permitting temperature to 40° C. or higher, alignment operations before press bonding are free from any troubles attributable to tackiness. By setting this temperature to 150° C. or lower, it is possible to prevent excessive curing of the photosensitive resin to provide enough time for press bonding, whereby a process margin can be widely taken. The thermal press bonding-permitting temperature means a temperature at which resin can sufficiently plug the patterns without causing problems of remaining voids and the resultant photosensitive resin film can be controlled so as to have such a viscosity that the resin does not flow out of the patterns.

When a vacuum laminator is employed for the formation of a resin layer on a printed wiring board, plugging of the circuit pattern on the printed wiring board improves.

When the dry film laminated on the printed wiring board has photosensitivity, it is exposed through a desired patterned photomask and developed to generate microholes and fine lines in the photosensitive resin layer on the printed wiring board. Examples of active energy beams used for exposure include electron beams, ultraviolet ray and X-ray, with ultraviolet ray being preferable. As a light source, it is possible to use a low-pressure mercury lamp, high-pressure mercury lamp, extra-high-pressure mercury lamp, halogen lamp, etc. The exposure dose is typically 100-1,000 mJ/cm$^2$.

After the exposure, the dry film is developed to remove non-exposed portions. Development is carried out by, for example, an immersion method or spraying method. As a developer, alkali aqueous solution (e.g., sodium hydroxide aqueous solution or sodium carbonate aqueous solution) is employable. After the development, the dry film is generally rinsed with water to remove remaining developer. Before water rinsing, developer components may be removed with a dilute acid aqueous solution.

After the development and water rinsing, the patterned resin layer may be cured by heat treatment to serve as a permanent protection film. The heat treatment is carried out continuously or stepwise at 140-450° C., preferably at 150-250° C. for 0.1-5 hours.

EXAMPLES

Hereinafter, the present invention will be described in more detail with reference to representative Examples, which however shall not be construed as limiting the scope of the invention thereto.

Evaluations conducted in Examples and Comparative Examples are described below.

(1) Bending Durability Test

An evaluation substrate was prepared which consists of a 18 μm-thick polyimide layer and a 9 μm-thick copper layer and has a 50 μm pitch line/space circuit pattern. The substrate was subjected to 260° C. reflow treatment twice under the recommendation conditions for reflow of lead-free solder paste. The bending test was conducted under the following condition: R=0.15; load=100 g; bending angle=180°. In the bending test the substrate was bent up to 200 times while checking the generation of any crack in the resin layer, confirming the number of bending cycles at which crack(s) was generated.

(2) Flame Retardancy Test

Evaluation was conducted in accordance with the UL94 Thin Material Vertical Burning Test. A three-layer copper clad flexible laminate consisting of a 9 μm-thick copper layer, a 18 μm-thick polyimide layer and a 9 μm-thick copper layer ("NEOFLEX® NFX-2ABEPFE(18Q)" from Mitsui Chemicals, Inc.) was prepared. The copper foil on either side of the flexible laminate was removed by etching, and a 25 μm-thick resin layer according to the present invention was attached to both sides of the exposed polyimide film to prepare a test piece. The test piece was evaluated for flame retardancy.

(3) Appearance after Electroless Ni Plating

A dry film obtained was bonded to metal surface and exposed through a photomask (hole diameter=200 μm) with an exposure device equipped with a high-pressure mercury lamp (ORC MANUFACTURING CO., LTD) at a dose of 100 mJ/cm$^2$. The exposed dry film was sprayed with 30° C. 1% sodium carbonate aqueous solution for 60 seconds at a spray pressure of 0.2 MPa. The dry film was heated at 230° C. for 20 minutes to fabricate a test piece.

The test piece was immersed in 40° C. acidic degreasing solution ("ICP Clean S-135" from Okuno Chemical Industries Co., Ltd.) for 4 minutes and rinsed with water. The test piece was then immersed in 14.4 wt % ammonium persulfate aqueous solution at 21° C. for 3 minutes and rinsed with water. Thereafter, the test piece was immersed in 10 vol % sulfuric acid aqueous solution for 1 minute at 21° C. and rinsed with water. The test piece was then immersed in 25° C. 4% hydrochloric acid aqueous solution for 30 seconds, immersed in catalytic solution ("ICP Accela" from Okuno Chemical Industries Co., Ltd.) for 1 minute, and rinsed with water. The test piece was plated with nickel by immersion in 80° C. electroless nickel plating solution ("ICP Nicoron GM-SD" from Okuno Chemical Industries Co., Ltd., pH=4.6) for 15 minutes and rinsed with pure water. The appearance of the test sample was observed for defects with a stereoscopic microscope at 40× magnification.

(4) Migration Resistance Test

A polyimide board with a 12 μm-thick comb-shaped copper circuit with a 35 μm pitch line/space pattern was prepared. 30VDC was applied for 1,000 hours at 85° C. and 85% RH to confirm the occurrence of short circuits due to insulation deterioration.

Example 1

Synthesis of Polyimide Precursor

A 300 ml-separable was flask fitted with a stirrer, Dean-Stark trap, reflux condenser, dropping funnel, and nitrogen inlet. In a nitrogen atmosphere, the flask was charged with 934 g N-methylpyrrolidone (Tokyo Chemical Industry Co., Ltd.), 400 g mesitylene (Kanto Chemical Co., Inc.) and 608 g oxydiphthalic acid dianhydride (MANAC Incorporated). With stirring, 577 g amino-terminated polypropylene glycol ("JEFFAMINE® D400" from Huntsman Corporation) was added dropwise in the flask over 1 hour. The internal temperature was raised to 180° C. After 4 hour-reflux at 180° C., the flask was cooled to 21° C. Thereafter, 159 g 1,3-bis(3-aminophenoxy)benzene (Mitsui Chemicals, Inc.) was added in the flask. Stirring was continued for 20 hours in a nitrogen atmosphere to produce a partially-imidized polyamic acid solution (polyimide precursor solution) with a solid content of 49 wt %.

Preparation of resin composition

To 59.3 g polyimide precursor solution obtained above, the following components were added at 21° C. and stirred for 30 minutes to produce a brown viscous liquid with a viscosity of about 2 Pa·s.

(1) Condensate of dipentaerythritol and ε-caprolactone where all of the 6 terminal functional groups are esterified with an acrylic acid ("KAYARAD®-DPCA60" from Nihon Kayaku Tokyo Co., Ltd.): 12.5 g
(2) N,N'-dimethylacetamide: 8.6 g
(3) Diethylthioxanthone ("KAYACURE®-DETX-S" from Nihon Kayaku Tokyo Co., Ltd.) as a photopolymerization initiator: 0.5 g
(4) Ethyl p-dimethylaminobenzoate ("KAYACURE®-EPA" from Nihon Kayaku Tokyo Co., Ltd.): 1.0 g
(5) Hexa(phenoxy)cyclotriphosphazene ("SPE-100" from Otsuka Chemical Co., Ltd.) as a flame retardant: 6.2 g
(6) 4 mole adduct of 9,10-dihydro-9-oxa-10-phosphaphenanthrene-10-oxide (compound having formula (1)) to a condensate of dipentaerythritol and ε-caprolactone where all of the 6 terminal functional groups are esterified with an acrylic acid in 80% polypropylene glycol monomethyl ether acetate solution ("HF-DPCA6070" from Showa Highpolymer Co., Ltd.): 11.7 g
(7) Benzoquanamine (Wako Pure Chemical Industries, Ltd.) as an additive: 0.1 g Production and Evaluation of Dry Film With an applicator, the obtained resin solution obtained above was applied onto a polyethylene terephthalate carrier film ("M5001" from TOYOBO Co., Ltd.) which is 30 cm in width and 19 μm in thickness, and dried in a circulating hot air oven for 8 minutes at 100° C. A 30 μm-thick polyethylene terephthalate cover film ("GF-130" from TAMAPOLY Co., Ltd.) was attached to the resin layer to produce a dry film.

After peeling off the cover film, the dry film was placed onto respective boards for evaluation. After alignment, the dry film was bonded by pressing with a vacuum laminator ("MVLP 600" from Meiki Co., Ltd.) for 60 seconds (press temperature=60° C., pressure=0.5 MPa).

The dry film was exposed to UV light through a given photomask at a dose of 600 mJ/cm$^2$ and sprayed with 30° C. 1.0% Na$_2$CO$_3$ aqueous solution at a pressure of 0.20 MPa to develop away non-exposed portions. After water rinsing and drying, the processed product was placed in a 160° C. circulating hot air oven for 60 minutes for heat curing. Evaluations for the obtained cured film are shown in Table 1.

Examples 2-, 4, Comparative Examples 1-4 and Reference Example 1

Resin compositions were prepared as in Example 1 except that the formulations shown in Table 1 were used. Dry films were produced from the respective resin compositions and similarly evaluated. The results are shown in Table 1.

TABLE 1

|  | Ex. 1 | EX. 2 | Ref. Ex. 1 | EX. 4 | Comp. Ex. 1 | Comp. Ex. 2 | Comp. Ex. 3 | Comp. Ex. 4 |
|---|---|---|---|---|---|---|---|---|
| Polyimide precursor solution | 59.3 | 61.1 | 61.9 | 61.1 | 57.8 | 66.8 | 60.4 | 63.1 |
| KAYARAD ® DPCA120 |  |  |  | 12.9 |  |  |  |  |
| KAYARAD ® DPCA60 | 12.5 |  |  |  |  |  |  | 13.3 |
| ARONIX ® M-402 |  | 12.9 | 13.2 |  | 12.4 | 14.3 | 12.9 |  |
| Benzoquanamine | 0.1 | 0.1 | 0.1 | 0.1 | 0.1 | 0.1 | 0.1 | 0.1 |
| KAYACURF ® DETX-S | 0.5 | 0.5 | 0.5 | 0.5 | 0.5 | 0.6 | 0.5 | 0.5 |
| KAYACURF ® EPA | 1.0 |  | 1.1 | 1.0 | 1 |  | 1.0 |  |
| Irgacure ® 907 |  | 1.0 |  |  |  | 1.1 |  | 1.1 |
| HF-DPCA6070 80 wt % in PGM-Ac | 11.7 | 12.1 |  | 12.1 |  |  |  |  |
| HF-DPHA70 70 wt % in PGM-Ac |  |  | 9.5 |  |  |  |  |  |
| SPE-100 | 6.2 | 6.4 | 5.2 | 6.4 |  |  |  | 10.0 |
| HF-TMPTA 80 wt % in PGM-Ac |  |  |  |  |  | 20.2 |  |  |
| HCA |  |  |  |  |  |  | 9.5 |  |
| HCA-HQ |  |  |  |  |  |  | 14.2 |  |
| Dimethylacetomide | 8.6 | 5.9 | 8.3 | 5.9 | 7.9 | 7.5 | 10.8 | 11.8 |
| Bending durability | >200 | >200 | >200 | >200 | 0 | 0 | 0 | 0 |
| Flame retardancy | VTM-0 | VTM-0 | VTM-0 | VTM-0 | VTM-0 | VTM-0 | VTM-0 | VTM-0 |
| Appearance after electroless Ni plating | Good | Good | Good | Good | Good | Good | Good | Good |
| Migration resistance | Good | Good | Good | Good | Good | Bad | Bad | Good |

Glossary of Terms of in Table 1

(1) KAYARAD®-DPCA120: acrylic acid-esterified condensate of dipentaerythritol and ε-caprolactone (Nihon Kayaku Tokyo Co., Ltd.)

(2) ARONIX® M-402: Dipentaerythritol hexa/pentaacrylate (TOAGOSEI Co., Ltd.)

(3) Irgacure® 907: 2-methyl-1-(4-methylthiophenyl)-2-monopholinopropane-1-one (Ciba Specialty Chemicals K.K.) as a photopolymerization initiator (4) HF-DPHA70 70 wt % in PGM-Ac: 4 mole adduct of 9,10-dihydro-9-oxa-10-phosphaphenanthrene-10-oxide (compound having formula (1)) to dipentaerythritol hexaacrylate in 70% polypropylene glycol monomethyl ether acetate solution (Showa Highpolymer Co., Ltd.)

(5) HF-TEMPTA 80 wt % in PGM-Ac: 2 mole adduct of 9,10-dihydro-9-oxa-10-phosphaphenanthrene-10-oxide (compound having formula (1)) to trimethylolpropane triacrylate in 80% polypropylene glycol monomethyl ether acetate solution (6) HCA: 9,10-dihydro-9-oxa-10-phosphaphenanthrene-10-oxide (compound having formula (1)) (SANKO Co., Ltd.)

(7) HCA-HQ: hydroquinone adduct of 9,10-dihydro-9-oxa-10-phosphaphenanthrene-10-oxide (compound having formula (1)) (SANKO Co., Ltd.)

Sufficient bending durability was ensured in Examples 1-2 and 4. By contrast, bending durability was poor in Comparative Examples 1-4. The reason for this is that while HF-DPCA6070 is used in the Examples, it is not used in the Comparative Examples.

The present application claims the priority of Japanese Patent Application No. 2007-126378 filed on May 11, 2007, the entire contents of which are herein incorporated by reference.

Industrial Applicability

As described above, a resin composition of the present invention can exert good flame retardancy after cured even without containing any halogenated compound or any antimony compound that has a high risk of putting a load on the environment. In particular, the resin composition can provide a protection film which can meet the recent stringent requirements for bending durability and insulation reliability.

The invention claimed is:

1. A resin composition comprising:

(A) polyimide precursor; and (B) adduct of an organophosphorus compound represented by the following formula (1) with a compound represented by the following formula (2)

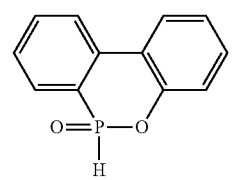

(1)

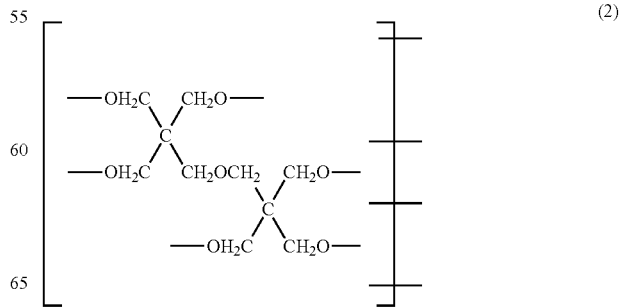

(2)

-continued

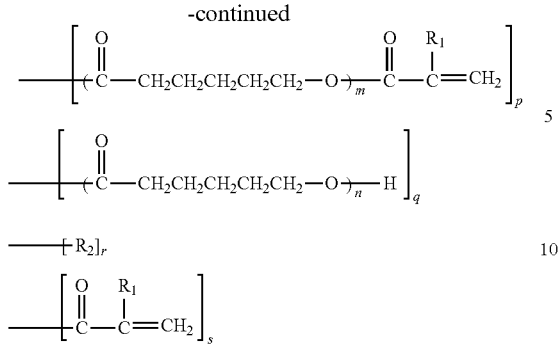

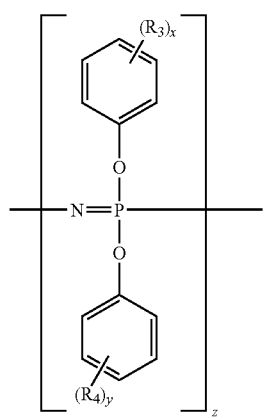

(where $R_1$ denotes a hydrogen atom or methyl group; $R_2$ denotes a hydrogen atom or monovalent organic group; n and m each denote an integer of 1-5; p denotes an integer of 1-6; q and r each denote an integer of 0-4; s denotes an integer of 0-5; the sum of p, q, r and s is 6; and the sum of p and s is 5-6).

2. The resin composition according to claim 1, further comprising (C) phosphazene compound.

3. The resin composition according to claim 1, further comprising (D) compound having at least two photopolymerizable unsaturated double bonds, and (E) photopolymerization initiator.

4. The resin composition according to claim 1, wherein (A) polyimide precursor is a polyamic acid.

5. The resin composition according to claim 2, wherein (C) phosphazene compound is a phenoxyphosphazene having the following formula (3) or (4)

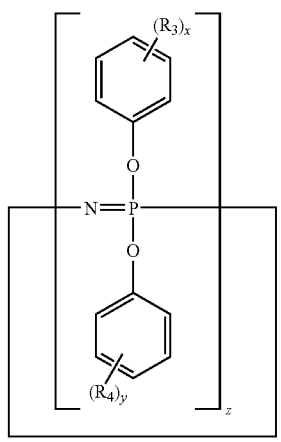

(4)

(where $R_3$ and $R_4$ each denote a monovalent organic group; x and y each denote an integer of 1-5; and z denotes an integer of 3-20).

6. The resin composition according to claim 1, wherein the amount of (B) component is 5-250 parts by mass per 100 parts by mass of (A) component.

7. The resin composition according to claim 2, wherein the amount of (C) component is 5-250 parts by mass per 100 parts by mass of the total of (A) component and (B) component.

8. The resin composition according to claim 3, wherein the total amount of (B) component and (C) component is 1-70 parts by mass per 100 parts by mass of the total of (A) component, (D) component and (E) component.

9. A dry film produced from a resin composition according to claim 1.

10. A processed product comprising a resin film formed of a dry film according to claim 9.

11. The processed product according to claim 10, wherein the processed product is a printed wiring board.

12. An electric device comprising a processed product according to claim 10.

13. An electric device comprising a processed product according to claim 11.

* * * * *